United States Patent
Dietz et al.

(10) Patent No.: US 7,518,231 B2
(45) Date of Patent: Apr. 14, 2009

(54) DIFFERENTIAL CHIP PERFORMANCE WITHIN A MULTI-CHIP PACKAGE

(75) Inventors: James Dietz, Cary, NC (US); Petros Negussu, Morrisville, NC (US); Thoai Thai Le, Cary, NC (US)

(73) Assignee: Infineon Technologies AG, Munich (DE)

(*) Notice: Subject to any disclaimer, the term of this patent is extended or adjusted under 35 U.S.C. 154(b) by 63 days.

(21) Appl. No.: 11/203,861

(22) Filed: Aug. 15, 2005

(65) Prior Publication Data

US 2007/0035007 A1  Feb. 15, 2007

(51) Int. Cl.
 *H01L 23/12* (2006.01)
(52) U.S. Cl. .................. 257/700; 257/E23.003
(58) Field of Classification Search ........... 257/700, 257/E23.003
See application file for complete search history.

(56) References Cited

U.S. PATENT DOCUMENTS

| | | | |
|---|---|---|---|
| 5,754,410 A * | 5/1998 | Bardsley et al. ........... | 361/777 |
| 5,900,770 A | 5/1999 | Sabin | |
| 6,335,494 B1 * | 1/2002 | Gregor et al. ............. | 174/261 |
| 6,649,931 B2 | 11/2003 | Honma et al. | |
| 6,732,304 B1 * | 5/2004 | Ong ........................ | 714/718 |
| 6,873,563 B2 | 3/2005 | Suwa et al. | |
| 2002/0060933 A1 | 5/2002 | Matsuzaki et al. | |
| 2003/0128602 A1 | 7/2003 | Nishimoto et al. | |
| 2003/0179010 A1 | 9/2003 | Gerstmeier et al. | |
| 2004/0103346 A1 * | 5/2004 | Dietz et al. ................ | 714/25 |
| 2005/0024977 A1 | 2/2005 | Ong | |
| 2007/0139164 A1 * | 6/2007 | O'Toole et al. ............ | 340/10.2 |

FOREIGN PATENT DOCUMENTS

| | | |
|---|---|---|
| DE | 10238323 | 4/2003 |
| JP | 09270698 | 10/1997 |
| JP | 10209848 | 8/1998 |

\* cited by examiner

*Primary Examiner*—Jerome Jackson, Jr.
*Assistant Examiner*—Jami M Valentine
(74) *Attorney, Agent, or Firm*—Patterson & Sheridan, L.L.P.

(57) ABSTRACT

A multi-chip package comprising at least a first die and a second die, wherein each die comprises an integrated circuit (IC) disposed thereon. Each of the first die and the second die comprise a plurality of contact pads coupled with the respective IC. The contact pads on the first IC comprise a first mode pad coupled to a first device formed on the first die, and the contact pads on the second IC comprise a second mode pad coupled to a second device formed on the second die. The first mode pad is coupled to a first potential and causes the first device to operate in a first mode. The second mode pad is coupled to a second potential and causes the second device to operate in a second mode. The first and second mode are selected based on the relative position of the first and second die.

9 Claims, 5 Drawing Sheets

DIFFERENTIAL CHIP PERFORMANCE WITHIN A MULTI-CHIP PACKAGE

BACKGROUND OF THE INVENTION

1. Field of the Invention

The invention generally relates to multi-chip packages (MCPs).

2. Description of the Related Art

Many electronic applications require a set of integrated circuit (IC) chips that are packaged together, for example, on a common printed circuit (PC) board. For example, many applications call for a processor and some type of memory or different types of memory, such as volatile memory (e.g., dynamic random access memory, or DRAM) and non-volatile (e.g., flash) memory, to be included on the same PC board. If economies of scale dictate, it is sometimes more cost effective to package these integrated circuits together into a single multi-chip package (MCP, which may also be referred to as a multi-chip module, or MCM)), that allows tight integration of the devices and occupies less PC board space.

FIG. 1 illustrates a prior art MCP 100 prior to package encapsulation. MCP 100 comprises an upper integrated circuit (IC) 110 positioned over a lower integrated circuit 120 which is positioned over a package substrate 140. Each of the layers 110, 120, 140 may be electrically isolated from each other by a layer of insulating material 115. Upper and lower pads 112, 122 formed on the upper and lower ICs 110, 120 are connected to pins on the substrate 140 with thin bond wires 150, 160, typically made of gold or aluminum. The bond wires are connected to the ICs 110, 120 and the substrate 140 using a wire bonding technique.

FIG. 1 illustrates an exemplary arrangement of upper and lower ICs 110 and 120. In other arrangements, the upper and lower ICs are of the same type and dimensions, such as where the ICs are both dynamic random access memory (DRAM) chips. The goal in such an arrangement is to either reach a higher density with the same data bus width (i.e. 256M×16 to 512M×16) or to get a higher performance by expanding the data bus width (i.e. 256M×16 to 512M×32) and at the same time maintain an operation specification that is slightly different (operating voltage, frequency) compared to the same chip in a single die package.

However, one problem that occurs with wire bonding in MCP is that the various ICs perform differently relative to one another due to the different bond wire lengths. For example, in FIGS. 1 and 2, the bond wire 150 connecting the upper IC 110 is relatively longer than the bond wire 160 connecting the lower IC 120. As a result, there is an impedance value difference between the upper and lower bond wires 160, 150. The difference in bond wire impedance results in a longer time for propagation of signals through the bond wire 150 connecting the upper IC 110 as compared to the signals propagating through the bond wire 160 connecting the lower IC 120. The longer propagation time results in an inferior performance of the upper IC 110 relative to the performance of the lower IC 120. Also, the difference in bond wire impedance may cause a relatively larger voltage drop in a power supply voltage provided to the upper IC 110 as compared to the power supply voltage provided to the lower IC 120. As a result of the relatively lower power supply voltage, the upper IC 110 may not perform as well as the lower IC 120. Consequently, the specification of the overall MCP performance is reduced.

Accordingly, what is needed are techniques and apparatus for improved multi-chip packaging performance.

SUMMARY OF THE INVENTION

One embodiment of the present invention provides a multi-chip package. The multi-chip package includes a die of the multi-chip package including an integrated circuit, a device, and a plurality of contact pads disposed on the die and coupled to the integrated circuit. The plurality of contact pads includes a pad (referred to herein as a mode pad) disposed on the die, wherein the mode pad being placed at different potentials causes the device to operate in one of at least two modes. The mode is selected based on a position of the die in the multi-chip package relative to at least one other die in the multi-chip package.

Another embodiment of the invention provides a multi-chip package including a first die of the multi-chip package including a first integrated circuit and a first plurality of contact pads disposed on the first die and coupled to the first integrated circuit, wherein the first plurality of contact pads includes a first mode pad coupled to a first device formed on the first die. The first mode pad is coupled to a first potential and causes the first device to operate in a first mode. The multi-chip package also includes a second die of the multi-chip package comprising a second integrated circuit and a second plurality of contact pads disposed on the second die and coupled to the second integrated circuit, wherein the second plurality of contact pads comprises a second mode pad coupled to a second device formed on the second die. The second mode pad is coupled to a second potential and causes the second device to operate in a second mode. The first mode and the second mode are selected based on the relative position of the first die and the second die. In another embodiment, the integrated circuit is a memory circuit.

Yet another embodiment of the invention provides a multi-chip package including a substrate and at least two dies disposed on the substrate, each die including a contact plurality of pads and a mode pad coupled to a device formed on the respective die, wherein the mode pad of at least one of the dies is coupled to a first potential causing the respective device to operate in a first mode and wherein the mode pad of at least one other die is coupled to a second potential causing the respective device to operate in a second mode, the mode being selected based on a relative position of the respective dies in the multi-chip package. Wire bonds couple the plurality of contact pads to contact elements of the substrate, thereby creating signal paths between the respective dies and the substrate.

Another embodiment of the invention provides a method of packaging integrated circuits in a multi-chip package. The method includes coupling a first plurality of contact pads disposed on a first die to a substrate, wherein the first die comprises a first integrated circuit coupled to the first plurality of contact pads and a first device coupled to a first mode selection pad and coupling the first mode selection pad to a first potential on the substrate, wherein coupling the first mode selection pad to the first potential causes the first device to operate in a first mode. The method also includes coupling a second plurality of contact pads disposed on a second die to the substrate, wherein the second die comprises a second integrated circuit coupled to the second plurality of contact pads and a second device coupled to a second mode selection pad, coupling the second mode selection pad to a second potential on the substrate, wherein coupling the second mode selection pad to the second potential causes the second device to operate in a second mode, and selecting the first mode and the second mode based on the relative position of the first die and the second die.

In yet another embodiment of the invention, a multi-chip package is provided which includes means for supporting circuitry, and means for housing a first integrated circuit, the means for housing the first integrated circuit disposed on the means for supporting, the means for housing the first integrated circuit including a means for connecting to the first integrated circuit and a means for selecting a mode of a first device formed on the means for housing the first integrated circuit. The means for selecting the mode of the first device is connected to a first potential causing the first device to operate in a first mode. The multi-chip package also includes means for housing a second integrated circuit, the means for housing the second integrated circuit disposed on the means for supporting, the means for housing the second integrated circuit including a means for connecting to the second integrated circuit and a means for selecting a mode of a second device formed on the means for housing the second integrated circuit. The means for selecting the mode of the second device is connected to a second potential causing the second device to operate in a second mode. The first and second mode are selected based on a relative position of the means for housing the first integrated circuit and the means for housing the second integrated circuit in the multi-chip package. The multi-chip package also includes means for coupling the means for connecting to the first integrated circuit and the means for connecting to the second integrated circuit to contact elements disposed on the means for supporting, thereby creating signal paths between the respective means for housing and the means for supporting.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide a multi-chip package, comprising a die of the multi-chip package comprising an integrated circuit, a device, and a plurality of contact pads disposed on the die and coupled to the integrated circuit. The plurality of contact pads comprises a mode pad disposed on the die, wherein the mode pad placed at to different potentials causes the device to operate in one of at least two modes. In one embodiment, the mode is selected based on a position of the die in the multi-chip package relative to at least one other die in the multi-chip package. In this manner, the integrated circuit may, for example, operate in a mode which compensates for performance losses due to packaging constraints of the multi-chip package. As used herein, operating in a mode may include enabling or disabling a device.

Figure 1:
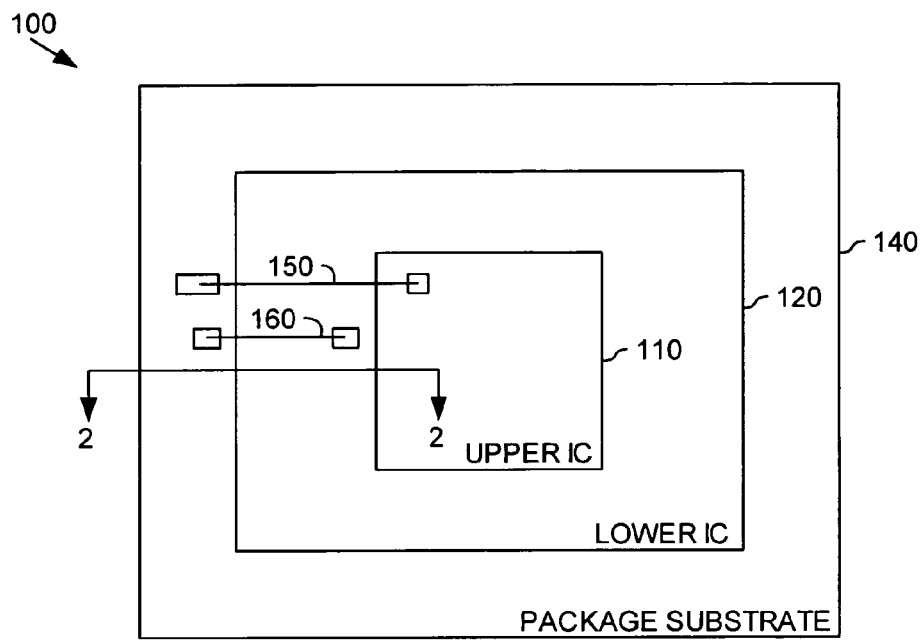
FIG. 1 is a diagram depicting an overhead view of a multi-chip package prior to encapsulation with an upper integrated circuit and a lower integrated circuit.
Figure 2:
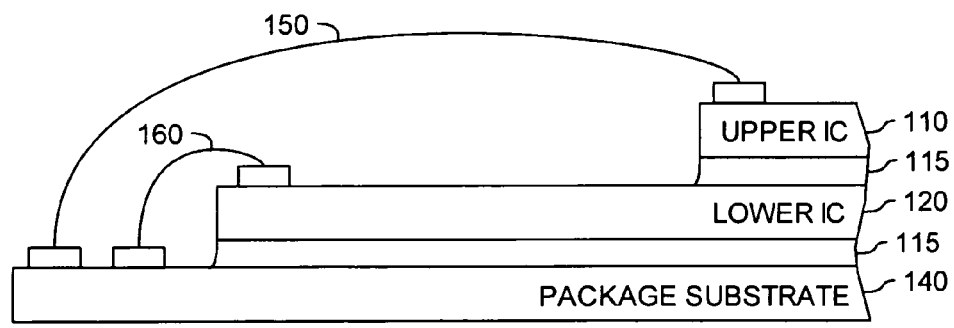
FIG. 2 is a diagram depicting a side view of a multi-chip package prior to encapsulation with an upper integrated circuit and a lower integrated circuit.
Figure 3:
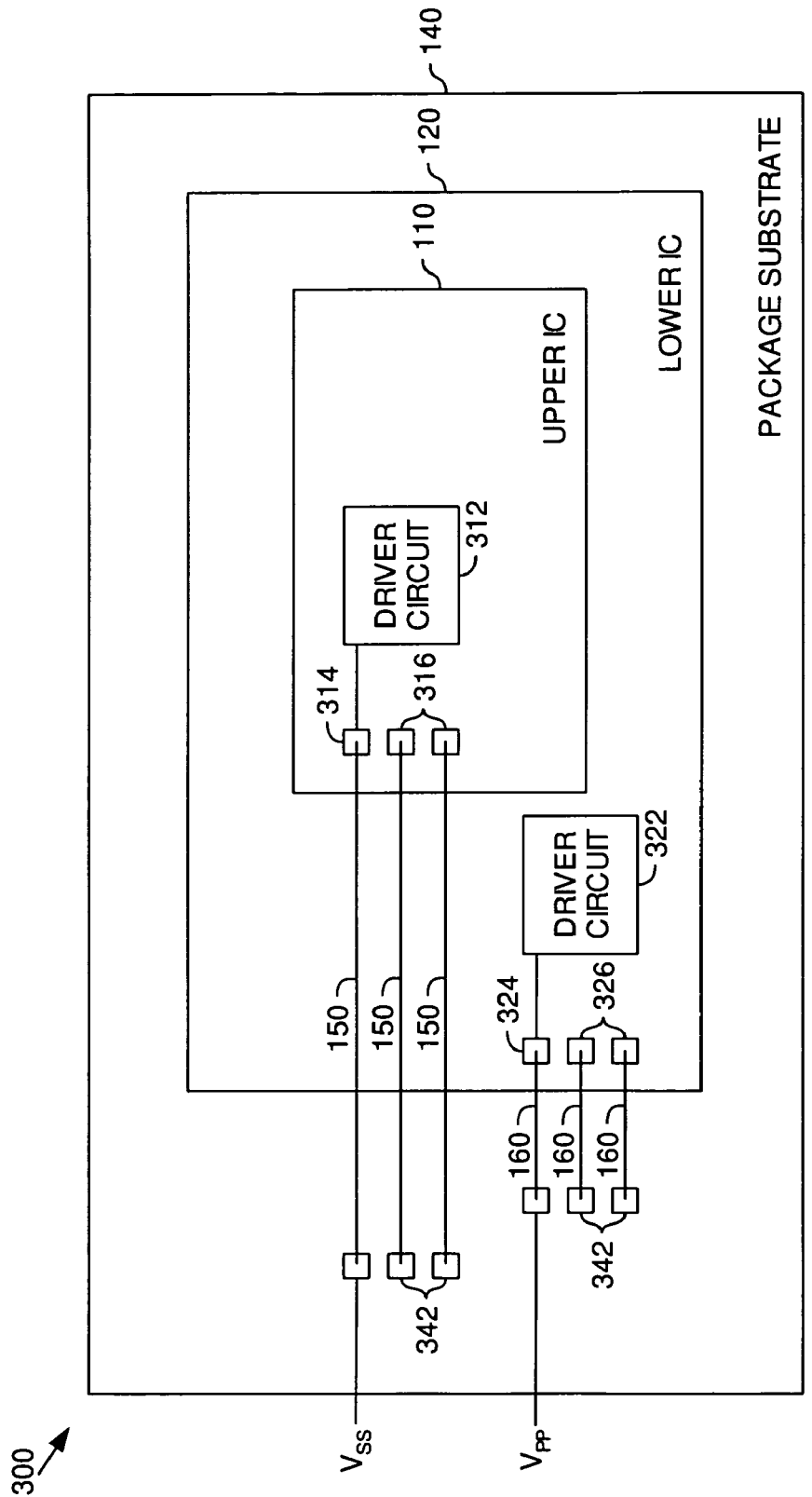
FIG. 3 is a diagram depicting an overhead view of a multi-chip package with an upper integrated circuit and a lower integrated circuit each having a mode selection pad according to one embodiment of the invention.
Figure 4:
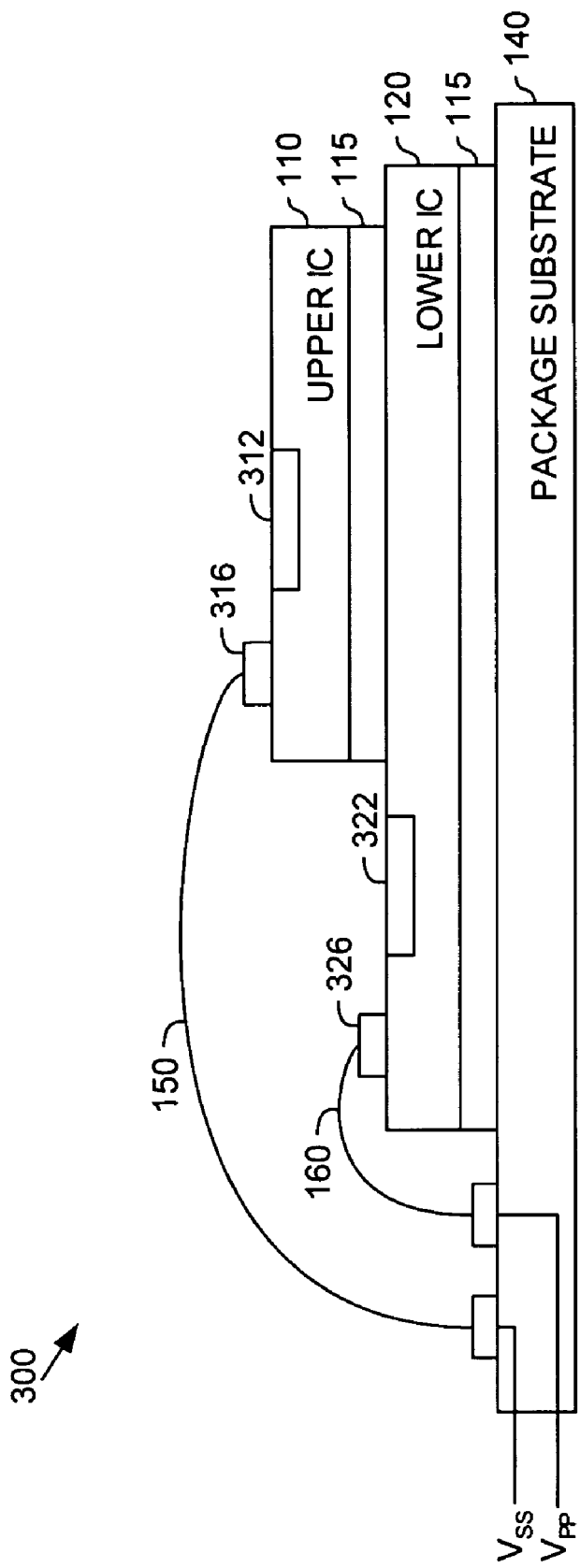
FIG. 4 is a diagram depicting a side view of a multi-chip package with an upper integrated circuit and a lower integrated circuit each having a mode selection pad according to one embodiment of the invention.

FIGS. 3 and 4 are diagrams depicting the overhead and side view of a multi-chip package 300 with upper and lower dies comprising an upper IC 110 and a lower IC 120 each having a mode selection pad 314, 324 according to one embodiment of the invention. In one embodiment of the invention, the mode pad may be a special pad dedicated to choosing the mode of the upper or lower IC 110, 120. In another embodiment of the invention, the mode pad may be a voltage supply pad wherein a mode is selected by applying a particular polarity to the voltage supply pad. Upper and lower ICs 110 and 120 may comprise any suitable circuitry, and may be of different types and/or dimensions. As an example, upper integrated circuit 110 may comprise dynamic random access memory (DRAM) circuitry, and lower integrated circuit 120 may comprise flash memory or electrically erasable programmable read only memory (EEPROM) circuitry. In other arrangements, the upper and lower ICs 110, 120 are of the same type and dimensions, such as where the ICs 110, 120 are both DRAM chips. As described above, the goal in such an arrangement is to either reach a higher density with the same data bus width (i.e. 256M×16 to 512M×16) or to get a higher performance by expanding the data bus width (i.e. 256M×16 to 512M×32) and at the same time maintain an operation specification that is slightly different (operating voltage, frequency) compared to the same chip in a single die package.

As another example, upper integrated circuit 110 may comprise any suitable memory circuitry, and lower integrated circuit 120 may comprise processor circuitry. As yet another example, upper integrated circuit 110 may comprise any suitable circuitry using complementary metal oxide semiconductor (CMOS) technology, and lower integrated circuit 120 may comprise any suitable circuitry using bipolar technology. Upper and lower integrated circuits 110 and 120 for one or more embodiments may comprise circuitry to form an MCP as a system in a package (SiP).

Each die comprising an IC 110, 120 in the package has one or more contact pads 316, 326 disposed on the die and coupled to the IC 110, 120. The upper and lower contact pads 316, 326 formed on the upper and lower ICs 110, 120 are conductively coupled to contact pads 342 on the substrate 140 with one or more interconnects. The substrate 140 may be formed of any suitable material. The one or more interconnects for one or more embodiments may comprise thin bond wires 150, 160. The bond wires 150, 160 may be made of gold or aluminum. According to one embodiment of the invention, the bond wires are connected to the ICs 110, 120 and the substrate 140 using a wire bonding technique. In another embodiment of the invention, other techniques may be used to bond the ICs 110, 120 to the substrate 140, for instance using silicon vias and bump pads. The upper and lower contact pads 316, 326 may be used for data input/output or for control of each of the ICs 110, 120.

The upper and lower ICs 110, 120 also have mode selection pads 314, 324 coupled to upper and lower driver circuits 312, 322. A mode selection pad is a contact pad which controls the mode of the IC on which the pad is disposed. The driver circuits 312, 322 may be used to drive signals off of the upper and lower ICs 110,120 and across the upper and lower bond wires 150,160. Accordingly, the driver circuits 312, 322 may be referred to as off-chip drivers (OCDs) because the signals are driven off of each chip. The mode selection pads 314, 324 may be used to place the drivers in one of two or more modes as described below.

As a result of the relative height difference between the upper and lower ICs 110, 120, the upper wire bonds 150 connecting the upper IC 110 to the package substrate 140 may be longer than the lower wire bonds 160 connecting the lower IC 120 to the package substrate 140. Accordingly, the longer wire bonds 150 for the upper IC 110 will have higher impedance (e.g. a greater resistance and a greater capacitance) than the wire bonds 160 for the lower IC 120. Because of the higher impedance of the wire bonds 150 for the upper IC 110, signals will take longer to propagate across the bonds 150 for the upper IC 110 than across the wire bonds 160 for the lower IC 120. The longer propagation time will result in a performance difference between the upper and lower ICs 110, 120.

To compensate for the performance difference between the upper and lower ICs 110, 120, the mode selection pads 314, 324 may be used to place the upper and lower driver circuits 312, 322 in different operational modes. By applying a first potential to the lower mode pad 324 (for instance, a high voltage level $V_{PP}$), the lower driver 322 may be placed in a first mode which is associated with the lower IC 120. In the first mode, the lower driver 322 may supply a default or regular amount of drive strength to drive signals from the lower IC 120 across the relatively shorter lower wire bonds 160. By applying a second potential to the upper mode pad 314 (for instance, a low voltage level, $V_{SS}$), the upper driver circuit 312 is placed in a second mode which is associated with the upper IC 110. In the second mode, the upper driver 312 may provide additional drive strength to drive signals across the relatively longer upper wire bonds 150.

The increased drive strength of the upper driver 312 operating in the second mode will reduce the time necessary for a signal driven by upper IC 110 to propagate across the upper wire bonds 150 by overcoming the higher impedance of the upper wire bonds 150. As a result, the increased performance of the upper driver 312 as compared to the lower driver 322 will compensate for the longer wire bonds 150 of the upper IC 110 and thus reduce the performance difference between the upper and lower ICs 110, 120. Accordingly, the overall performance of the package will be increased. Also, because the lower driver 322 is not using increased drive strength, the lower driver 322 will typically not consume as much power as the upper driver 312.

Figure 5:
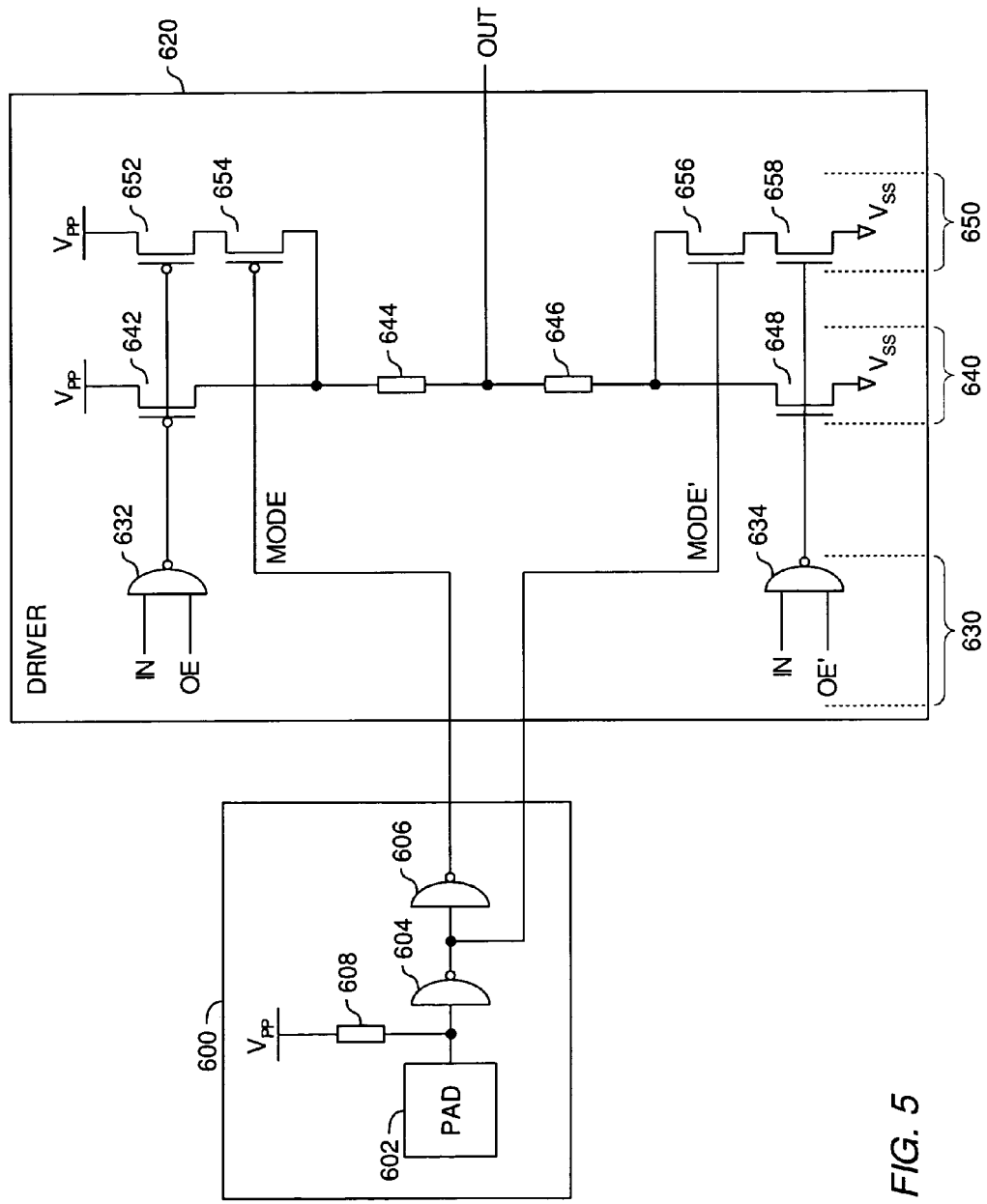
FIG. 5 is a circuit diagram depicting a mode selection circuit and driver circuit having multiple modes according to one embodiment of the invention.

FIG. 5 is a circuit diagram depicting a mode selection circuit 600 and off-chip driver circuit 620 having multiple modes according to one embodiment of the invention. The mode selection circuit 600 may contain a physical contact pad 602 as well as a pair of inverting buffers 604, 606 which generate a pair of inverse control signals used to control the modes of the driver circuit 620 (the non-inverted signal may be referred to as the MODE signal, and the inverted signal may be referred to as MODE'). The mode selection circuit 600 may also contain a pull-up resistor 608 which may be used to choose a default mode for the driver circuit 620. As depicted, the pull-up resistor 608 is connected to $V_{PP}$ (a high voltage). If the mode pad 602 is left unconnected (also referred to as a floating connection), by default the pad voltage may be pulled to a potential, also referred to as the floating potential, by the pull-up resistor 608. Where the pull-up resistor 608 is connected to $V_{PP}$, the floating potential is a high potential which may place the circuit 620 in the first mode. The mode selected when the pad 602 is left unconnected may also be referred to as the default mode. If, instead, the pull-up resistor 608 were connected to $V_{SS}$ (a low voltage), the unconnected mode pad 602 would be pulled to a low potential, placing the circuit in the second mode. Thus, the default mode may be either of the modes of the driver circuit 620. Regardless of what potential the pull-up resistor 608 is connected to, the default mode provided by the pull-up resistor 608 may be overridden by connecting the mode pad 602 to the desired potential.

In addition to the MODE signal, the driver circuit 620 may have other input signals. These signals may be used to enable the driver (the OE signal) and to drive a value (the IN signal) off of the chip. Each combination of control signals may be used to place the driver circuit 620 in different states with different drive strengths as depicted in Table 1. Generally, the driver circuit 620 only drives a signal when both the IN signal and OE signal are high logic levels (i.e., there is input and the output is enabled). When desired, the driver 620 may provide extra drive strength (corresponding to the second mode) where the MODE signal is a low logic level. The use of the signals to generate the drive strengths associated with each mode is described in detail below.

TABLE 1

Off-Chip Driver Controls

| Driver States | OE | IN | MODE | Default Driver | Additional Driver | Overall Driver Output Strength |
|---|---|---|---|---|---|---|
| 1. | 0 | 0 | 0 | Hi-Z | Hi-Z | Hi-Z |
| 2. | 0 | 0 | 1 | Hi-Z | Hi-Z | Hi-Z |
| 3. | 0 | 1 | 0 | Hi-Z | Hi-Z | Hi-Z |
| 4. | 0 | 1 | 1 | Hi-Z | Hi-Z | Hi-Z |
| 5. | 1 | 0 | 0 | 0 | 0 | 0 (INCREASED) |
| 6. | 1 | 0 | 1 | 0 | Hi-Z (OFF) | 0 (NORMAL) |
| 7. | 1 | 1 | 0 | 1 | 1 | 1 (INCREASED) |
| 8. | 1 | 1 | 1 | 1 | Hi-Z (OFF) | 1 (NORMAL) |

The driver circuit 620 comprises three areas of circuitry: control circuitry 630, a default driver 640, and an additional driver 650. The control circuitry 630 generates control signals for the default driver 640 and the additional driver 650. The default driver 640 is used to drive a signal onto the output (OUT) of the driver circuit 620 regardless of the selected mode. The drive strength provided by the default driver 640 may be referred to as normal or regular drive strength. The additional driver 650 is used to increase the drive strength of the driver 620 depending on the selected mode. The drive strength provided by the default driver 640 and the additional driver together 650 may be referred to as increased drive strength. Load resistors 644, 646 are used to balance the driver load output and are sized based on the expected load driven by the output.

The control circuitry 630 comprises a NAND gate 632 and NOR gate 634 which are used to turn on the default driver 640 and selectively enable the additional driver 650. The inputs to the NAND gate 632 are the IN signal and the OE signal, and the inputs to the NOR gate 634 are the IN signal and OE' (the inverse of the OE signal). If one or both of the input signals to the NAND gate 632 is a low logic level (LOW or '0'), the output of the NAND gate will be a high logic level (HIGH or '1'). If one or both of the input signals to the NOR gate 632 is a high logic level (HIGH or '2'), the output of the NOR gate will be a low logic level (LOW or '0').

Where OE is a low logic level, the output of the NAND gate 632 is a high logic level and the output from the NOR gate 632 is a low logic level. A high logic level from the NAND gate 632 will turn the upper PMOS transistor 642 of the default driver 640 off, and a low logic level from the NOR gate 634 will turn the lower NMOS transistor 648 of the default driver 640 off. Where the upper PMOS transistor 642 is off and the lower NMOS transistor 648 is off, the driver output OUT is not connected to any supply voltage. When the driver output is not connected to any voltage, the driver is place in a high-impedance state (Hi-Z) and will not drive any logic value onto the driver output. The signals from the NAND gate 632 and NOR gate 634 are also applied to the outer PMOS transistor 652 and outer NMOS transistor 658 of the additional driver 650. Thus, where the default driver 640 is in a high-impedance state, the additional driver 650 will also be in a high-impedance state. This scenario (where OE is a low logic level and both drivers are in a high impedance state) is depicted by driver states 1-4 in Table 1.

Where IN and OE are both a low logic level, the output of NAND gate 632 is a high logic level which turns the upper PMOS transistor 642 of the default driver 640 off, and the output of the NOR gate 634 is a high logic level which turns the lower NMOS transistor 648 of the default driver 640 on. When the upper PMOS transistor is off and the lower NMOS transistor is on, the output of the driver 620 is connected to $V_{SS}$ through the lower NMOS transistor 648 and the driver accordingly drives a low logic level onto the driver output. This scenario (where OE and IN are a low logic level and the output of the driver is a low logic level) is depicted by driver states 5-6 in Table 1.

The default driver 640 is turned on when both IN and OE are a high logic level. Where IN and OE are both a high level, the output of the NOR gate 634 is a low logic level which turns the lower NMOS transistor 648 of the default driver 640 off. At the same time, the output of the NAND gate 632 is also a low logic level which turns the upper PMOS transistor 642 on, connecting the driver output OUT to $V_{PP}$ and thus turning the default driver 640 on. At the same time, the output of the NOR gate 634 turns the outer NMOS transistor 658 of the additional driver 650 off and the output of the NAND gate 632 turns the outer PMOS transistor 652 of the additional driver 650 on. Thus, when the default driver 640 is turned on, the additional driver 650 will be enabled.

When the default driver 640 is on and the additional driver 650 is enabled, the output of the additional driver 650 will depend on the MODE' signal input to the inner NMOS transistor 656 of the additional driver 650 and the MODE signal input to the inner PMOS transistor 654 of the additional driver 650.

Where the pad 602 is connected to a low logic level (MODE='0' and MODE'='1'), MODE' will turn the inner NMOS transistor 656 on, but because the outer NMOS transistor 658 is off, OUT will not be connected to $V_{SS}$. At the same time, MODE='0' will turn the inner PMOS transistor 654 on and thus connect $V_{PP}$ to OUT through the inner and outer PMOS transistors 654, 652 of the additional driver 650. The additional driver 650 will accordingly be turned on, and increased drive strength will be applied to OUT. In some cases, the extra drive strength provided by the additional driver 650 may be increased by sizing the transistors 652, 654, 656, 658 of the additional driver 650 according to the desired increase. The signals corresponding to increased drive strength are depicted by driver state 7 in Table 1.

Where the pad 602 is connected to a high logic level (MODE='1' and MODE'='0'), MODE' will turn the inner NMOS transistor 656 on, and because the outer NMOS transistor 658 is off, OUT will not be connected to $V_{SS}$. At the same time, MODE='1' will turn the inner PMOS transistor 654 off and thus extra drive strength will not be provided through the inner and outer PMOS transistors 654, 652 of the additional driver 650. The additional driver 650 will accordingly be turned off, while the default driver 640 will remain on, and normal drive strength will be applied to OUT. The signals corresponding to normal drive strength are depicted by driver state 8 in Table 1.

In one embodiment of the invention, the mode pad 600 may not be directly connected the driver 620. According to one embodiment, the logic level on the mode pad 620 may be read into a latch or into a register, such as an extended mode register (referred to as EMR). Where multiple mode pads 620 are provided (as described below), the value on each mode pad may be read into a latch or register such as EMR. The value in the latch or register may then be decoded, for instance, by control circuitry on the IC, and the decoded result may be used to select an appropriate mode for the driver 620 and/or other devices.

The circuit depicted in FIG. 5 is merely one exemplary embodiment of an off-chip driver having multiple modes. Other embodiments should be readily apparent to those skilled in the art. For example, the driver may be designed as shown with BiCMOS technology; however other designs and technologies known to those skilled in the art may used as well.

Use in Manufacturing and Other Embodiments

In one embodiment of the invention, the multiple-mode IC may be manufactured on identical ICs used in the same multi-chip package. As described above, depending on the placement of the IC within the package, an appropriate mode may be selected for the IC by connecting the mode pad for the IC to an appropriate potential.

The mode pads for each IC in the multi-chip package may be connected to the appropriate potential for the desired mode in a number of manners according to different embodiments of the invention. In one embodiment of the invention, the mode pad connections may be routed in the substrate from the corresponding contact pads to the appropriate potential. The potential may be supplied to the substrate by an external power supply connected to the pins of the multi-chip package. Such routing and connection to the appropriate potential may take place during a manufacturing phase of the multi-chip package. After the contact pads for each of the ICs have been connected to the appropriate contact pads on the substrate, the substrate and the ICs may be encapsulated in a multi-chip package having external pins. The first and second integrated circuits may be encapsulated in any suitable manner using any suitable material. After encapsulation, the package may be installed for use with other devices, for instance on a printed circuit board (PCB) connecting the devices.

In other embodiments, instead of directly connecting the mode pad to an appropriate potential during a manufacturing phase of the package, the mode pad connections may be routed through the substrate contact pads to an external pin on the multi-chip package. The external pin on the chip may then be used by a purchaser of the package (such as an original equipment manufacturer (OEM)) to select an appropriate mode for each device within the multi-chip package.

In other embodiments, different arrangements of the ICs within the package and of contact pads on the die are imagined. For instance, the pads may be disposed on a central, inner portion of the die as opposed to an outer portion of the die. Also, the dies may be both face up, or one face up and one face down, meaning contact pads formed on an upper surface of the bottom die are facing away from the substrate. Furthermore, as used in this detailed description, directional terms such as, for example, upper, middle, lower, top, bottom, and over are used for convenience to describe a multi-chip package relative to one frame of reference regardless of how the multi-chip package may be oriented in space.

In one embodiment, the final encapsulation of each IC may be performed by the manufacturer of the IC. According to another embodiment, the encapsulation may be performed by another manufacturer of the multi-chip package. Accordingly, the manufacturer of the IC may provide a number of the multiple-mode ICs to the manufacturer of the package. The package manufacturer may choose to place two of the same ICs in a single package and connect the mode selection pads to the substrate according to the embodiments described above. Optionally, the package manufacturer may place one of the multiple-mode ICs in a package with a processor, and select the mode of the IC according to its position within the package. Also, the manufacturer of the package may ultimately decide to provide the IC in a single-chip package, in which case only a single mode of the IC may be selected by the package manufacturer during packaging.

While described above with respect to an off-chip driver having a normal and increased drive strength mode, other embodiments of the invention are contemplated wherein other on-chip devices have multiple modes and wherein more than two modes are provided. In one embodiment, a plurality of special mode pads may be provided for controlling a number of features. For instance, the special mode pads may be used to select a clock frequency or a power consumption mode depending on the placement of the IC within the multichip package. The mode selection pads may also be used adjust an internal voltage of the IC or to change a timing characteristic of the IC such as the setup and hold times for data being output by the IC.

Figure 6:
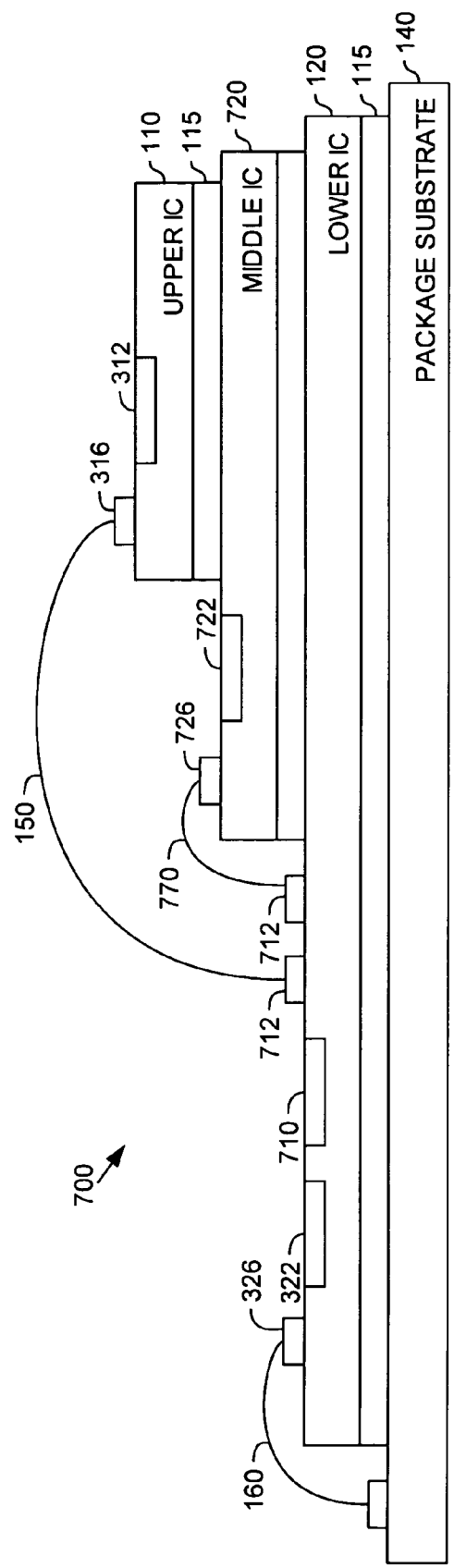
FIG. 6 is a diagram depicting a side view of a multi-chip package prior to encapsulation with an upper integrated circuit, a middle integrated circuit, and a lower integrated circuit according to one embodiment of the invention.

In other embodiments, three or more ICs may be placed in a single multi-chip package, and the means of connecting each IC to the substrate may be varied. FIG. 6 is a diagram depicting a side view of a multi-chip package 700 prior to encapsulation with an upper IC 110, a middle IC 720, and a lower IC 120 according to one embodiment of the invention. Like the dies for the upper and lower ICs 110, 120, the middle die including the middle IC 720 has one or more contact pads 726 disposed on the die and coupled to the IC 720. The middle IC 720 also includes a driver circuit 722 and a mode selection pad coupled to the driver circuit 722.

In one embodiment, the contact pads 316, 726 on the upper and middle ICs 110, 720 may be connectively coupled to two or more contact pads 712 disposed on the lower die and coupled to routing circuitry 710 on the lower die. The coupling between the contract pads 316, 726, 712 may comprise thin bond wires 150, 770. The routing circuitry 710 may route the contact pads 712 connected to the upper and middle ICs 110, 720 to other contact pads 326 on the lower IC 120. The contact other pads 326 on the lower IC 120 may then be used to connectively couple the contact pads 316, 726 on the upper and middle ICs 110, 720 to the contact pads 342 on the packaging substrate 140 using interconnections such as bond wires 160. In addition to routing traces, the routing circuitry 710 on the lower IC 120 may also include other circuitry which may be used, for instance, to insert a timing delay into signals propagating from the middle and upper IC's 110, 720 to the substrate 140. In another embodiment, the routing between each of the ICs 110, 720, 120 and the substrate 140 may be accomplished using a bridge layer (not depicted) disposed between the layers of the package and coupled to the ICs 110, 720, 120 and the substrate 140.

Where three or more ICs are placed in a single multi-chip package, a combination of drive strengths may be provided depending on the relative positions each chip. For instance, two mode selection pads (MODE1 and MODE2) may be provided for each IC within the multi-chip package. The two mode selection pads may be used to select one of four modes for a driver on each IC. Such a selection is described in Table 2 below.

If an IC having the four-mode driver is placed on the bottom of the package, the wire bonds connecting that IC to the substrate will be the shortest, and thus the regular driver strength (mode 4, MODE1='1' and MODE2='1') may be used to drive signals off of the chip. If the IC is placed higher in package (2nd from the bottom or 3rd from the bottom), the wire bonds connecting the IC to the chip will be longer and a mode with greater drive strength (⅓ INCREASE or ⅔ INCREASE) may be selected accordingly (driver modes 2 and 3, respectively). If the IC is placed at the top of the package, the wire bonds connecting that IC to the substrate will be the longest in the package and the maximum strength of the driver may be selected using the mode pads (mode 1, MODE1='0' and MODE2='0'), providing the largest compensation for the performance differential between the top IC and the lower ICs in the package. If still additional modes are needed in a package (e.g., more than four modes), additional mode selection pads may added to select the additional modes accordingly.

TABLE 2

Off-Chip Driver with Four Modes

| Driver Mode | MODE1 | MODE2 | Driver Strength |
|---|---|---|---|
| 1. | 0 | 0 | MAXIMUM |
| 2. | 0 | 1 | ⅔ INCREASE |
| 3. | 1 | 0 | ⅓ INCREASE |
| 4. | 1 | 1 | REGULAR |

While the foregoing is directed to embodiments of the present invention, other and further embodiments of the invention may be devised without departing from the basic scope thereof, and the scope thereof is determined by the claims that follow.

What is claimed is:

1. A multi-chip package, comprising:
a plurality of data inputs;
a first supply voltage input configured to receive a first supply voltage level;
a second supple voltage input configured to receive a second supple voltage level different from the first supply voltage level;
a substrate comprising a plurality of first contact pads, at least one first supply voltage pad, and at least one second supply voltage pad, wherein the first contact pads are coupled to the plurality of data inputs, wherein the first supple voltage pad is coupled to the first supply voltage input, and wherein the second supply voltage pad is coupled to the second supple voltage input;
a die of the multi-chip package comprising an integrated circuit, a driver circuit including a default driver and an additional driver, a plurality of second contact pads and at least one first mode pad coupled to the additional driver; and an interconnect conductively coupling the plurality of first contact pads and the plurality of second contact pads, wherein the first mode pad is coupled to the first supply voltage pad when the interconnect has a first length, and wherein the first mode pad is coupled to the second supply voltage pad when the interconnect has a second length, the second length being greater than the first length, wherein the additional driver is configured to be disabled when the first mode pad is connected to the first supply voltage pad and to be enabled when the first mode pad is connected to the second supply voltage pad, and wherein the driver circuit is configured to output a first output signal with a first power level provided by the default driver, and a second output signal with a second power level provided by the default driver and the additional driver, the second power level being higher than the first power level.

2. The multi-chip package of claim 1, wherein the mode is selected to achieve a relatively more balanced performance of the integrated circuit relative to a further integrated circuit in the multi-chip package.

3. The multi-chip package of claim 1, wherein the first mode pad is coupled to the first supply voltage pad when the length of the interconnect is shorter than a predetermined length, and wherein the first mode pad is coupled to the second supply voltage pad when the length of the interconnect is longer than the predetermined length.

4. A system, comprising the multi-chip package of claim 1 and a plurality of electrical components, the plurality of electrical components being at least one of structurally and functionally related.

5. The system of claim 4, wherein at least one of the plurality of electrical components is a printed-circuit board (PCB).

6. A multi-chip package, comprising:
a substrate comprising a plurality of first contact pads, at least one first supply voltage pad, and at least one second supply voltage pad;
a first die of the multi-chip package comprising a first integrated circuit, a first driver circuit including a default driver and an additional driver, a plurality of second contact pads and at least one first mode pad coupled to the additional driver, wherein the additional first driver is configured to be disabled when the first mode pad is connected to the first supply voltage pad and to be enabled when the first mode pad is connected to the second supply voltage pad;
a first interconnect conductively coupling a number of the plurality of first contact pads and the plurality of second contact pads, the first interconnect having a first length;
a second die of the multi-chip package comprising a second integrated circuit, a second driver circuit including a default driver and an additional driver, a plurality of third contact pads and at least one second mode pad coupled to the additional driver, wherein the additional driver is configured to be disabled when the second mode pad is connected to the first supply voltage pad and to be enabled when the second mode pad is connected to the second supply voltage pad; and
a second interconnect conductively coupling a number of the plurality of first contact pads and the plurality of third contact pads, the second interconnect having a second length longer than the first length, wherein the first mode pad is coupled to the first supply voltage pad and the second mode pad is coupled to the second supply voltage pad, and wherein the first driver circuit outputs a first output signal with a first power level provided by the default driver, and the second driver circuit outputs a second output signal with a second power level provided by the default driver and the additional driver, the second power level being higher than the first power level.

7. multi-chip package of claim 6 wherein the first mode and the second mode are selected to achieve a relatively more balanced performance of the first and second dies.

8. The multi-chip package of claim 6, wherein the first and second interconnect comprises wire bonds.

9. A multi-chip package, comprising:
means for supporting a plurality of first contact pads, at least one first supply voltage pad, and at least one second supply voltage pad;
means for housing a first die of the multi-chip package comprising a first integrated circuit, a first driver circuit including a default driver and an additional driver, a plurality of second contact pads and at least one first mode pad coupled to the additional driver, wherein the additional first driver is configured to be disabled when the first mode pad is connected to the first supply voltage pad and to be enabled when the first mode pad is connected to the second supply voltage pad, the means for housing the first integrated circuit being disposed on the means for supporting;
first means for conductively coupling a number of the plurality of first contact pads and the plurality of second contact pads, the first means for conductively coupling having a first length;
means for housing a second die of the multi-chip package comprising a second integrated circuit, a second driver circuit including a default driver and an additional driver, a plurality of third contact pads and at least one second mode pad coupled to the additional driver wherein the additional driver is configured to be disabled when the second mode pad is connected to the first supply voltage pad and to be enabled when the second mode pad is connected to the second supply voltage pad, the means for housing the second integrated circuit disposed on the means for supporting;
second means for conductively coupling a number of the plurality of first contact pads and the plurality of third contact pads, the second means for conductively coupling having a second length longer than the first length, wherein the first mode pad is coupled to the first supply voltage pad and the second mode pad is coupled to the second voltage pad, and wherein the first driver circuit outputs a first output signal with a first power level provided by the default driver, and the second driver circuit outputs a second output signal with a second power level provide by the default driver and the additional driver, the second power level being higher than the first power level.

* * * * *